(12) United States Patent
Chen et al.

(10) Patent No.: US 6,756,309 B1
(45) Date of Patent: Jun. 29, 2004

(54) FEED FORWARD PROCESS CONTROL METHOD FOR ADJUSTING METAL LINE RS

(75) Inventors: Chii-Ping Chen, Hsinchu (TW); Wen-Chen Chien, Hsin-Chu (TW); Ching-Ming Tsai, Miaoli (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/356,247

(22) Filed: Jan. 30, 2003

(51) Int. Cl.[7] ..................... H01L 21/302; H01L 21/461
(52) U.S. Cl. ................ 438/692; 438/14; 438/624; 438/626; 438/631; 438/633; 438/637
(58) Field of Search ................ 438/618, 622, 438/624, 626, 631, 633, 637, 645, 669, 692, 14, 687

(56) References Cited

U.S. PATENT DOCUMENTS

| | | | | |
|---|---|---|---|---|
| 4,793,895 A | * | 12/1988 | Kaanta et al. | 438/17 |
| 5,219,787 A | * | 6/1993 | Carey et al. | 438/637 |
| 5,234,868 A | * | 8/1993 | Cote | 438/16 |
| 6,271,047 B1 | * | 8/2001 | Ushio et al. | 438/14 |
| 6,326,299 B1 | * | 12/2001 | Homma et al. | 438/633 |

OTHER PUBLICATIONS

Chan et al. "Process control and monitoring with laser interferometry based endpoint detection in chemical mechanical planarization", Aug. 1998, IEEE, pp. 377–384.*
Sakai et al. "Development of a novel air–back wafer carrier with an integrated end–point detector for copper CMP application", Jun. 1999, IEEE, pp. 183–186.*

* cited by examiner

Primary Examiner—Maria Guerrero
(74) Attorney, Agent, or Firm—Tung & Associates

(57) ABSTRACT

A method for achieving a predetermined electrical resistance of a semiconductor device metal line in a CMP process including providing a semiconductor process wafer comprising at least one dielectric layer for etching an opening through a thickness of the at least one dielectric layer; measuring a thickness of the at least one dielectric layer prior to etching the opening; etching the opening through a thickness of the at least one dielectric layer; measuring at least one dimension of the opening from which at least an opening depth is determined; forming a metal layer to fill the opening; and, performing a chemical mechanical polish (CMP) process to remove at least the metal layer overlying the opening level to form a metal filled opening according to a projected metal filled opening electrical resistance.

19 Claims, 2 Drawing Sheets

FEED FORWARD PROCESS CONTROL METHOD FOR ADJUSTING METAL LINE RS

FIELD OF THE INVENTION

This invention generally relates to chemical mechanical polishing (CMP) and more particularly to a method for dynamically adjusting a CMP process according to predetermined previous measurements of layer and feature dimensions in a feed-forward process to achieve a targeted metal line electrical resistance (Rs).

BACKGROUND OF THE INVENTION

In semiconductor fabrication integrated circuits and semiconducting devices are formed by sequentially forming semiconductor device features (structures) in sequential layers of material in a bottom-up manufacturing method. In order to form reliable devices, close tolerances are required in forming features, for example metal lines to achieve precise control of the electrical resistance, frequently measured as a sheet resistance (Rs), of the various metal lines.

For example, prior art processes rely on CMP planarization methods for determining a final metal line thickness. For example, in a damascene metallization process, one or more dielectric insulating layers are formed followed by anisotropic etching to form a trench opening in the dielectric insulating layer. Following formation of the trench, metal is deposited to fill the trench opening which is followed by a CMP process to planarize the upper surface of the process wafer and to define the final dimension of the metal line.

In the formation of metal lines, also referred to as conductive interconnections, copper is increasingly used for forming metal interconnects such as vias and trench lines since copper has low resistivity and good electromigration resistance compared to other traditional interconnect metals such as aluminum. The undesirable contribution to electrical parasitic effects by metal interconnect resistivity has become increasingly important as device sizes have decreased. As device sizes decrease even further, it is becoming more important to precisely control the width and depth of the metal lines in order to precisely control the resistance of the metal lines.

In prior art processes, the determination of the final thickness of the metal lines, for example copper metal lines, is determined following a copper CMP process where an excess of copper deposited to fill the trench opening is removed from the overlying surface. In prior art processes, deviations originating in processes prior to CMP and contributing to the final depth of the metal lines is not taken into account in formulating subsequent processes such as CMP. For example copper CMP typically relies on polishing times determined from expected results based on previous model processes. Following the CMP process the thickness of the metal layer is determined which in part determines a sheet resistance. If prior process deviations unexpectedly contribute to a less than desirable metal line thickness (resistance), there is little that can be done to correct the problem especially if the CMP process has removed an excessive amount of the metal line.

Therefore, there is a need in the semiconductor art to develop an improved method for achieving improved metal line electrical resistance precision including a CMP polishing process.

It is therefore an object of the invention to provide an improved method for achieving improved metal line electrical resistance precision including a CMP polishing process while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for achieving a predetermined electrical resistance of a semiconductor device metal line in a CMP process.

In a first embodiment, the method includes providing a semiconductor process wafer comprising at least one dielectric layer for etching an opening through a thickness of the at least one dielectric layer; measuring a thickness of the at least one dielectric layer prior to etching the opening; etching the opening through a thickness of the at least one dielectric layer; measuring at least one dimension of the opening from which at least an opening depth is determined; forming a metal layer to fill the opening; and, performing a chemical mechanical polish (CMP) process to remove at least the metal layer overlying the opening level to form a metal filled opening according to a projected metal filled opening electrical resistance.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained with respect to implementation in the context of a copper filled single damascene structure, it will be appreciated that the present invention is equally applicable to the formation of other metal filled damascenes including dual damascenes. It will be further appreciated that the method of the present invention is envisioned to be used multiple times in the manufacture of a multi-level semiconductor device and that the particular semiconductor manufacturing processes set forth herein are intended to exemplify the practice of the present invention. It will be also understood that the use of the term 'copper' herein includes copper or alloys thereof.

Figure 1:
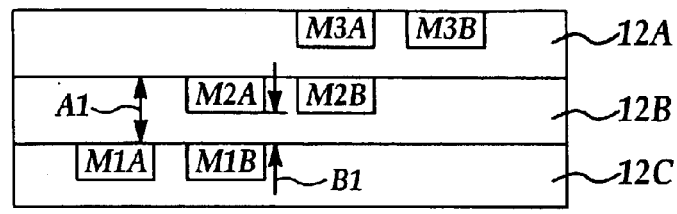
FIG. 1 is a cross sectional side view representation of a portion of exemplary multi-level semiconductor device and dimensional measurements made according to an embodiment of the present invention.

Referring to FIG. 1, in an exemplary application of the present invention, is shown a cross sectional side view representation of a portion of a semiconductor device included in a semiconductor process wafer having multiple insulating dielectric layers e.g., 12A, 12B, and 12C, also referred to as inter-metal dielectric (IMD) layers including metal filled lines, also referred as metallization lines e.g., M1A and M1B formed in IMD layer 12A, M2A and M2B formed in IMD layer 12B, and M3A and M3B formed in IMD layer 12C.

The IMD layers may be formed from any dielectric insulating material including organic and inorganic materials such as fluorinated silicate glass (FSG), $SiO_2$, or lower dielectric constant material such as carbon doped $SiO_2$. Etching stop layers (not shown) may also be included in the layers 12A, 12B, and 12C at a lower portion of the layer, a mid portion of the layer separating two dielectric insulating layers and at an upper portion of the layer. For example silicon oxynitride (e.g., SiON) is frequently used as both an etching stop layer and an anti-reflectance coating (ARC) layer overlying an upper portion the IMD layer.

In the method according to the present invention, following deposition of the IMD layer e.g., 12B, the thickness of the IMD layer is determined. For example the IMD layer thickness measurement preferably includes measurement or accounting for the thickness of etching stop layers and ARC layers. For example the thickness of multiple transparent or semi-transparent films may be measured by ellipsometry methods such as variable angle spectroscopic ellipsometry (VASE). Other methods such as reflection spectroscopy where an underlying layer is reflective, FTIR spectroscopy or X-ray fluorescence methods may be used to determine the IMD layer thickness. More preferably, an ellipsometric method is used since it offers more flexibility in the thickness measurement of multiple transparent or semi-transparent layers including thin metal layers. The dimensional measurements according to the present invention are preferably, carried out on one or more thickness monitor wafers (e.g., processes carried out in parallel) over predetermined areas of the monitor wafer process surface, for example along a scribe line.

The IMD layer thickness is preferably determined following CVD deposition processes, for example HDP-CVD or LP-CVD to form the IMD layer preferably following formation of overlying dielectric layers such as etching stop or ARC layers, if present. The determined IMD layer thickness, for example with respect to IMD layer 12B is shown as A1. Following trench etching, a dimension B1 including a remaining portion of the unetched IMD layer is determined. Determination of B1 is especially important where no etching stop layer is included in the IMD layer making the trench etching depth susceptible to variations.

Figure 2A:
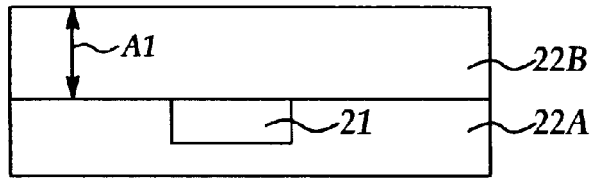
FIGS. 2A–2D are cross sectional side view representations of an exemplary copper containing semiconductor feature at different stages of manufacture including dimensional measurements and CMP process according to embodiments of the present invention.

For example, referring to FIG. 2A, is shown an expanded view of an exemplary embodiment showing a portion of an IMD layer 22B formed overlying a metal pad 21, for example a copper filled trench line formed in an underlying IMD layer 22A. For simplicity, the IMD layer 22B is shown as a single layer of material, without showing the presence of optionally formed underlying and/or overlying etching stop and/or ARC layers. The dimension A1 includes the thickness of the IMD layer 22B including optional etching stop and/or ARC layers (not shown). The dimension A1 is determined following deposition of the IMD layer 22B including overlying etching stop, ARC, and oxide capping layers, for example by plasma enhanced CVD methods. The IMD layer thickness A1 is preferably determined prior to trench etching.

Figure 2B:
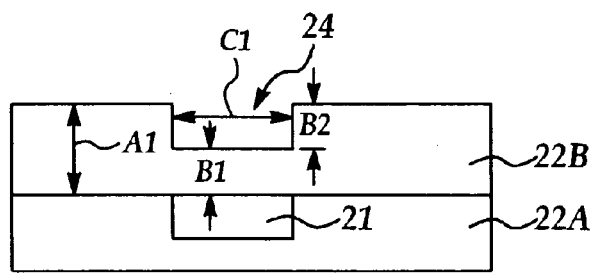

Referring to FIG. 2B, a trench opening 24 is anisotropically etched, for example, according to a reactive ion etch (RIE) process following a photolithographic patterning process. According to another embodiment, the trench width C1, or critical dimension (CD), is determined following the photolithographic patterning process, more preferably following the trench etching process as trench etching may affect the final trench width. The trench width or CD is determined, for example by optical or scanning electron microscopic (e.g., CDSEM) methods.

Following the trench opening etching process, according to one embodiment, a trench depth dimension is determined according to thickness metrology methods as discussed with respect to determining the IMD layer thickness. For example, the remaining portion of the IMD layer thickness B1 underlying the trench is preferably determined by variable angle spectroscopic ellipsometry (VASE) but may be determined by other methods as discussed. Alternatively the trench depth B2 may be determined by subtracting the dimension B1 from the IMD layer thickness A1. In one embodiment, for example where copper metal is used in a subsequent step to fill the trench opening, the dimension B1 is preferably determined prior to and/or following blanket deposition of a barrier layer to line the trench opening. Preferably, the dimension B1 includes the barrier layer thickness. It will be appreciated that the barrier layer thickness may be estimated or determined by other methods, but is preferably included in the B1 dimension (trench depth dimension).

Figure 2C:
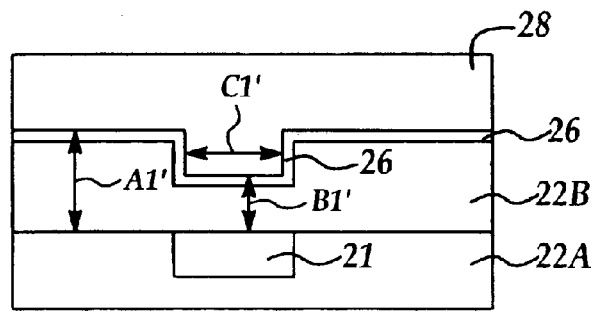

For example, in one embodiment referring to FIG. 2C, a refractory metal and/or refractory metal nitride barrier layer 26, such as tantalum, titanium, tungsten and nitrides thereof are blanket deposited to line the trench opening 24 prior to deposition of copper layer 28. Preferably the barrier layer thickness is less than about 500 Angstroms as ellipsometry methods to determine thickness may be used with metal layers thinner than about 500 Angstroms. The B1 thickness is shown as B1' to include the barrier layer thickness, the C1 width dimension is shown as C1' preferably excluding the barrier layer thickness and the A1 IMD layer thickness is shown as A1' to include the barrier layer thickness. Following formation of the barrier layer 26, the copper layer 28 is deposited to form a copper overlayer thickness at the process surface for example by an electro-chemical deposition method including prior of a copper seed layer.

According to an embodiment of the present invention, prior to carrying out a metal CMP process, for example a copper CMP process to remove at least the copper layer overlying the process surface, a targeted metal line thickness is determined to achieve a targeted electrical resistance (R) or sheet resistance (Rs) of the metal line following the metal CMP process. For example, the electrical resistance of a metal line is given by $R=\rho L/WT$, where R is the resistance, $\rho$ is the resistivity of the metal, L is the length of the metal line, W the width or CD of the metal line, and T the thickness of the metal line. If the width is constant and the resistance of a length of the metal line is the same as the thickness, for example in a four point probe measurement, a sheet resistance, Rs is inversely proportional to the metal line thickness T. Thus, preferably knowing the dimensional measurements A1 (or A1'), B1 (or B1'), and C1 (or C1') according to previous dimensional measurements, to determine a targeted metal line depth T (e.g., B3 below), the targeted final depth of the metal filled trench (metal line) may be determined to achieve the targeted metal line resistance R or sheet resistance Rs.

For example, preferably at least one of the determined dimensions IMD layer thickness (A1 or A1'), trench depth (e.g., B1 or B1'), and trench width (C1 or C1') are determined according to preferred embodiments and fed forward (supplied) to determine a targeted metal line depth prior to CMP. For example, undetermined values may be optionally estimated according to prior processes carried out under similar conditions. More preferably, however, at least the IMD layer thickness (A1 or A1') and trench depth dimension (e.g., B1 or B1') are determined and fed forward to be used in determining a targeted metal line thickness B3 or IMD layer thickness A2 optionally including the barrier layer 26, prior to CMP Most preferably, all three dimensions, A1 (A1'), B1 (B1'), and C1 (C1') are determined according to preferred embodiments and fed forward to be used in determining a targeted metal line depth B3 prior to CMP.

Figure 2D:
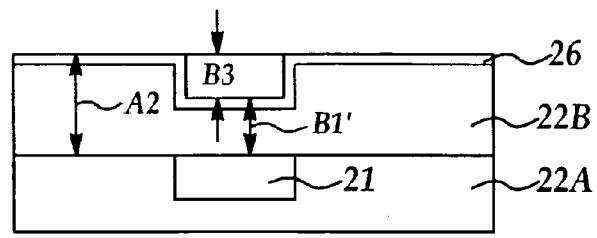

For example, referring to FIG. 2D, in the metal CMP process, for example a copper CMP process, multiple polishing steps are used to first remove copper layer 28 to reveal the underlying barrier layer 26, for example tantalum nitride (TaN), followed by removing all or a portion of the barrier layer 26, followed by an optional oxide buffing process to remove a portion of the IMD layer 22B if required, including uppermost ARC or etching stop layers. Preferably, in an embodiment of the present invention the targeted metal line thickness (B3 or A2-B1) is adjusted by altering the thickness portion of barrier layer 26 removal and/or the removed thickness portion of IMD layer 22B in the oxide buffing process. For example following the copper layer 28 polishing process to endpoint detection of exposure of a portion of the barrier layer 26, a targeted CMP polishing time for removal of all or a portion of the barrier layer 26 and if necessary, a portion of the IMD layer 22B in a subsequent oxide buffing process is effected to achieve a targeted final metal line thickness B3. For example, referring again to FIG. 2D, the targeted metal line thickness B3 is determined by projecting a targeted final IMD layer thickness A2 and subtracting the previously determined trench depth dimension B1 (B1') to determine a final metal line (trench line) depth B3. For example, a desired final IMD layer thickness A2 is determined, for example by adjusting the desired removed thickness portion of the barrier layer and/or IMD layer (polishing endpoint). CMP is then carried out for a predetermined period of time, preferably prior to reaching endpoint, followed by optional periodic removal and measurement of a remaining thickness of the barrier layer 26 and/or IMD layer 22B to determine a deviation from a desired A2 dimension and project an updated polishing endpoint. For example, a thickness monitor wafer undergoing parallel CMP polishing may be removed and transferred to a thickness measurement station according to preferred embodiments, to determine an IMD layer and barrier layer thickness to determine whether the targeted A2 thickness dimension and consequently, the targeted final metal line final thickness B3, has been reached. A new polishing endpoint (CMP time period) to achieve dimension A2 (or B3) is then projected followed by a subsequent CMP polishing time and a subsequent A2 thickness dimension measurement. Preferably, the amount of metal dishing in the polishing process is taken into account to determine the targeted metal line thickness B3.

Figure 3:
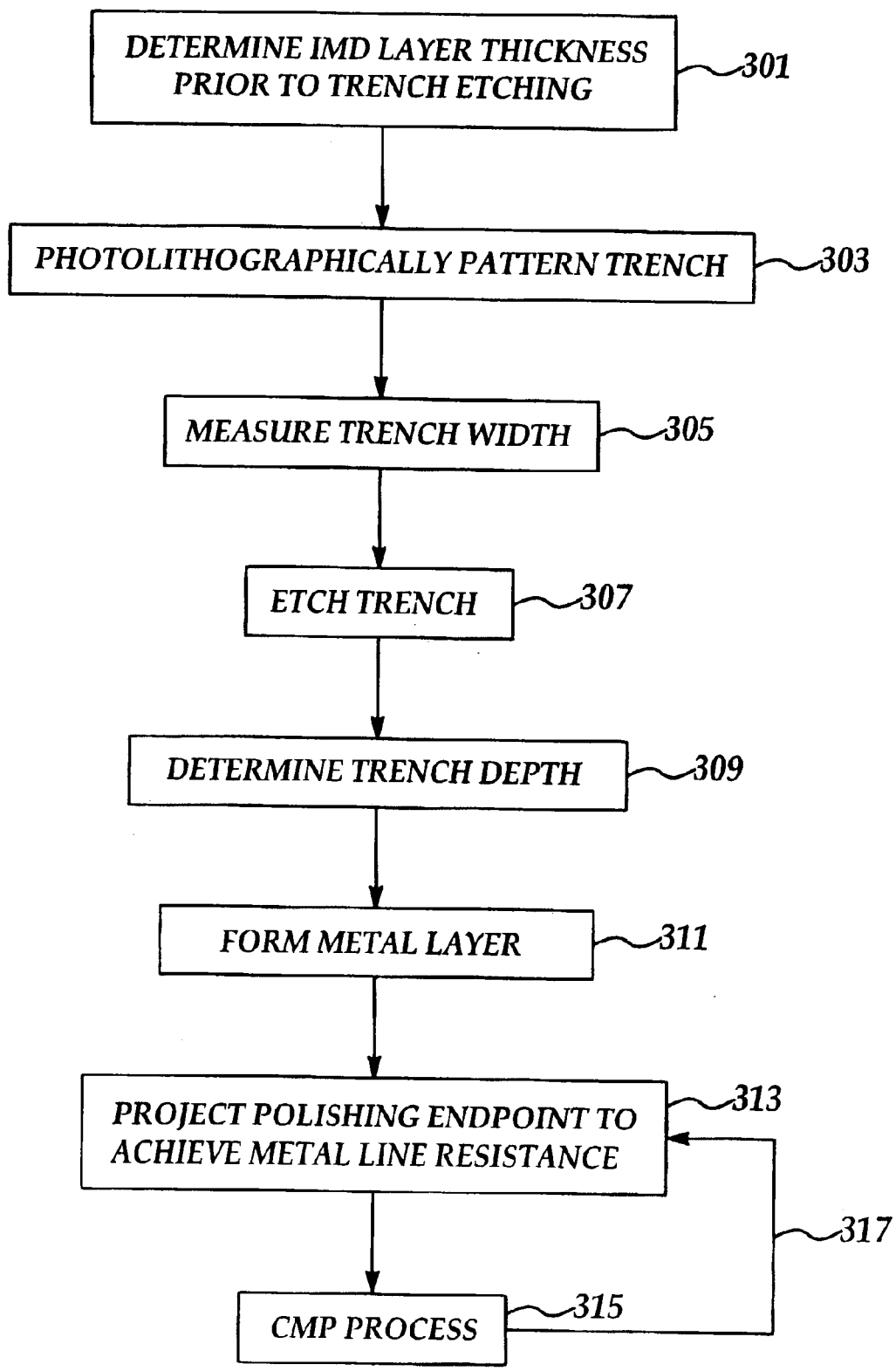
FIG. 3 is a process flow diagram including several embodiments of the method according to the present invention.

Referring to FIG. 3 is a process flow diagram including several embodiments of the present invention. In process 301, an IMD layer thickness is determined prior to metal trench etching. In process 303, a photolithographic patterning process is carried out. In process 305, the trench width is measured. In process 307, a trench etching process is carried out to form a trench opening. In process 309, a trench depth dimension from which a trench depth is determined is measured. In process 311, a metal layer is formed to fill the trench opening. In process 313 a polishing endpoint is projected to achieve a targeted metal line depth and targeted metal line resistance in a subsequent CMP process. In process 315, the CMP process performed. As indicated by directional process arrow 317, process 313 and process 315 are optionally repeated to achieve the targeted metal line depth and resistance.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for achieving a predetermined electrical resistance of a semiconductor device metal line in a CMP process comprising the steps of:

providing a semiconductor process wafer comprising at least one dielectric layer for etching an opening through a thickness of the at least one dielectric layer;

measuring a first thickness of the at least one dielectric layer prior to etching the opening;

etching the opening through at least a portion of the first thickness;

measuring the opening width;

forming a barrier layer to line the opening;

determining the opening depth;

projecting a chemical mechanical polish (CMP) polishing endpoint to achieve a targeted metal filled opening electrical resistance comprising using the opening width and depth to determine a desired polishing removal portion of material layers selected from the group consisting of the barrier layer and the at least one dielectric layer;

forming a metal layer to fill the opening; and, performing a chemical mechanical polish (CMP) process to the CMP polishing endpoint.

2. The method of claim 1, wherein the targeted metal filled opening electrical resistance comprises a sheet resistance.

3. The method of claim 1, wherein the at least one dielectric layer is selected from the group consisting of dielectric insulating layers, etching stop layers, and anti-reflectance coating (ARC) layers.

4. The method of claim 1, wherein the step of determining the opening depth comprises determining the barrier layer thickness.

5. The method of claim 1, wherein the CMP polishing endpoint comprises leaving a portion of the barrier layer thickness in place.

6. The method of claim 1, wherein the opening is a trench line opening.

7. The method of claim 1, wherein the metal is selected from the group consisting of copper, aluminum, tungsten, and alloys thereof.

8. The method of claim 1, wherein the CMP polishing endpoint comprises removing a portion of the at least one dielectric layer.

9. The method of claim 1, wherein the steps of measuring a first thickness and determining the opening depth comprise optical measurements selected from the group consisting of ellipsometry, reflectance spectroscopy, FTIR spectroscopy, and x-ray fluorescence.

10. The method of claim 1, wherein the step of performing a chemical mechanical polish (CMP) process comprises periodically determining a remaining thickness comprising the at least one dielectric layer.

11. The method of claim 10, wherein at least one thickness monitor wafer is supplied for determining the remaining thickness.

12. A method for achieving a predetermined electrical resistance of a semiconductor device metal line in a CMP process comprising the steps of:

provoiding a semiconductor process wafer comprising at least one dielectric layer for etching a trench opening through a thickness of the at least one dielectric layer;

measuring a thickness of the at least one dielectric layer prior to etching the trench opening;

etching the trench opening through a thickness portion of the at least one dielectric layer;

measuring the trench opening width;

depositing a barrier layer to line the trench opening;

determining the trench opening depth;

forming a metal layer to fill the trench opening; and, performing a chemical mechanical polish (CMP) process using the trench opening width and depth to project a CMP polishing endpoint to form a metal filled opening having a predetermined electrical resistance.

13. The method of claim 12, wherein the CMP process comprises leaving a portion of the barrier layer in place.

14. The method of claim 12, wherein the at least one dielectric layer comprises at least one layer selected from the group consisting of IMD layers, etching stop layers, and anti-reflectance coating (ARC) layers.

15. The method of claim 12, wherein the step of performing a chemical mechanical polish (CMP) process comprises periodically determining a remaining thickness of at least one of the barrier layer and the at least one dielectric layer.

16. The method of claim 12, wherein the metal is selected from the group consisting of copper, aluminum, tungsten, and alloys thereof.

17. The method of claim 12, wherein the CMP polishing process comprises removing a portion of the at least one dielectric layer.

18. The method of claim 12, wherein the steps of measuring a thickness and determining the trench opening depth comprise optical measurements selected from the group consisting of ellipsometry, reflectance spectroscopy, FTIR spectroscopy, and x-ray fluorescence.

19. The method of claim 15, wherein at least one thickness monitor wafer is supplied for determining the remaining thickness.

\* \* \* \* \*